US006383941B1

(12) United States Patent
Shen et al.

(10) Patent No.: US 6,383,941 B1
(45) Date of Patent: May 7, 2002

(54) METHOD OF ETCHING ORGANIC ARCS IN PATTERNS HAVING VARIABLE SPACINGS

(75) Inventors: Meihua Shen, Fremont, CA (US); Kenju Nishikido, Chiba (JP); Jeffrey D. Chinn, Foster City; Dragan Podlesnik, Palo Alto, both of CA (US)

(73) Assignee: Applied Materials, Inc., Santa Clara, CA (US)

( * ) Notice: Subject to any disclaimer, the term of this patent is extended or adjusted under 35 U.S.C. 154(b) by 0 days.

(21) Appl. No.: 09/611,085

(22) Filed: Jul. 6, 2000

(51) Int. Cl.$^7$ ................................................ H01L 21/00
(52) U.S. Cl. ...................... 438/714; 148/33.2; 216/67; 216/79; 257/437; 438/719; 438/725
(58) Field of Search ................................ 438/714, 719, 438/725, 735; 216/2, 67, 79; 148/33.2, 33.3; 257/437; 428/98, 156, 163, 170

(56) References Cited

U.S. PATENT DOCUMENTS

| | | | | |
|---|---|---|---|---|
| 5,753,418 A | 5/1998 | Tsai et al. | ..................... | 430/313 |
| 5,773,199 A | 6/1998 | Linliu et al. | ................ | 430/316 |
| 5,910,453 A | 6/1999 | Gupta et al. | ................ | 438/717 |
| 5,962,195 A | 10/1999 | Yen et al. | .................... | 430/316 |
| 5,965,461 A | 10/1999 | Yang et al. | ................. | 438/717 |
| 6,001,541 A | 12/1999 | Iyer | .......................... | 430/322 |
| 6,187,688 B1 * | 2/2001 | Ohkuni et al. | .............. | 438/725 |

FOREIGN PATENT DOCUMENTS

| | | |
|---|---|---|
| EP | 0 820 093 A1 | 1/1998 |
| EP | 0 859 400 A2 | 8/1998 |
| EP | 0 932 187 A2 | 7/1999 |
| WO | WO 99/30360 | 6/1999 |

OTHER PUBLICATIONS

Mitsuhiro Ohkuni et al., "High Performance Etching Process for Organic Films using SO$_2$/O$_2$ Plasma", Japanese Journal of Applied Physics, vol. 37, No. 4B, Apr. 1998, pp. 2369–2372.

Yan Ye et al., "0.35–Micron and Sub–0.35 Micron Metal Stack Etch in A DPS Chamber—DPS Chamber and Process Characterization", Electrochemical society Proceedings vol. 96–12, pp. 222–233.

* cited by examiner

*Primary Examiner*—William A. Powell
(74) *Attorney, Agent, or Firm*—Shirley L. Church; Kathi Bean

(57) ABSTRACT

The present disclosure relates to semiconductor processing, and to the plasma etching of organic layers, and in particular antireflective coating layers. We have discovered a particular combination of gases useful in producing chemically reactive plasma species, which provides unexpected control over etched feature critical dimension, etch profile, and uniformity of etch across a substrate surface, despite a difference in the spacing of etched features over the substrate surface. The combination of gases which produces chemically reactive plasma species consists essentially of $C_xH_yF_z$, a bromine-comprising compound (which is typically HBr), and O$_2$, where x ranges from 1 to 4, y ranges from 0 to 3, and z ranges from 1 to 10. Oxygen atoms may be substituted for hydrogen atoms in the $C_xH_yF_z$ compound to a limited extent Essentially inert gases which do not produce chemically reactive species may be added to the combination of etchant-species producing gases. A combination of CF$_4$/HBr/O$_2$ has been demonstrated to work well. With this combination of plasma source gases, critical Dimension (CD) uniformity control across the surface of the substrate is generally improved by using a volumetric ratio of $C_xH_yF_z$:HBr ranging from about 2:1 to about 5:1, with a range of about 3:1 to about 4:1 being preferred. An increased plasma density also helps improve CD uniformity control. The volumetric ratio of $(C_xH_yF_z+HBr):O_2$ should range between about 1:1 to 5:1, with a range of about 2:1 to about 3:1 being preferred.

17 Claims, 8 Drawing Sheets

METHOD OF ETCHING ORGANIC ARCS IN PATTERNS HAVING VARIABLE SPACINGS

BACKGROUND OF THE INVENTION

1. Field of the Invention

The present invention pertains to a method of etching organic antireflection coatings (ARCs). Organic antireflection coatings, as indicated by their name, include carbon and hydrogen containing materials, which are typically polymeric. The antireflection coatings are part of an etch stack used to produce semiconductor devices, and they are pattern etched to submicron dimensions. The present method permits uniform etching of ARCs over a semiconductor wafer surface, while providing control over dimensional shifts in the critical dimension of the etched feature size during etching.

2. Brief Description of the Background Art

In the field of semiconductor device fabrication, it is well recognized that as device feature sizes decrease to about 0.18 μm and smaller, mask patterning via photoresist materials requires the use of deep ultra violet wavelength (DUV) imaging radiation. Antireflective coatings are used in combination with DUV photoresists, among other photoresists, to reduce standing waves and back scattered light, so that the dimensions of the patterning in the photoresist can be better controlled.

Generally the photoresist is applied over a stack of other layers which are patterned as a part of the semiconductor device fabrication process. Some of the layers in the stack are consumed during the process of patterning underlying layers which become part of the functioning device. An ARC layer may be present at a number of different locations within a stack of layers, depending on the application. When the ARC layer is applied over the top of a layer stack, it is referred to as a top antireflective coating (TAR), when the ARC layer lies beneath the photorcsist layer, it is commonly referred to as a bottom antireflective coating (BARC). TAR coatings are frequently removed during the photoresist patterning (developing) process, while BARC layers most often require dry etching removal.

Processes for the dry etching of organic ARCs usually are accomplished in a plasma etch system. ARC etching plasma source gases vary considerably in composition and may include, for example $CHF_3/CF_4/Ar$—$O_2$; $CF_4/He$—$O_2$; $O_2/N_2$; $HBr/O_2$; $HBr/CO_2/O_2$—$Ar$.

One process for etching organic antireflective coatings overlying a silicon-containing substrate is as follows. The substrate is placed into a process chamber and a process gas comprising oxygen and a compound selected from a group of compounds consisting of hydrogen and bromine-containing compounds, hydrogen and iodine-containing compounds, and mixtures thereof, is introduced into the chamber. A plasma of the process gas is generated in the process chamber to etch the coating. Processing variables are adjusted to provide anisotropic etching of the organic antireflective coating.

According to another etching process, an anti-reflection coating underlying a DUV photoresist is etched by employing a mixture of oxygen plasma, nitrogen plasma, and at least one inert gas. The antireflective coating layer can also be etched by employing a layer of nitrogen plasma and an inert gas, without the oxygen plasma, although the etch rate will be reduced.

Another method for plasma etching an organic buried antireflective coating (BARC) layer utilizes etch chemistry provided by a plasma processing gas which includes hydrogen bromide (HBr), $CO_2$ and $O_2$, with Argon or another inert material.

In general, the references pertaining to etching of organic layers and antireflective coating layers place great emphasis on maintenance of the critical dimension of the feature being etched, such as a line width, contact pad dimension, gate size, and so on. Emphasis is also placed on the selectivity of the etch process, where the etch rate of an ARC layer is compared with the etch rate of an adjacent layer of material, such as a silicon-containing layer underlying the ARC layer, for example. Another important variable, which is not as frequently addressed, is the etched feature critical dimension uniformity control across a substrate, such as a semiconductor wafer. For example, when the pattern being etched into an ARC layer is a series of lines and spaces, and the spacing between the lines is different at different positions on the substrate surface, the etch rate of the ARC may vary at different positions on the substrate surface. This may affect the depth of etch and may affect the profile of the feature being etched. It also affects the critical dimension uniformity across the substrate. The phenomenon of a change in overall etch performance across a substrate surface as a function of the spacing between etched features is sometimes referred to as a "microloading" effect. Differences in etch rate and/or etched feature profile occur in part because the availability of etchant species at a given position on the substrate surface varies, and the amount of etch byproduct which is produced at a given position varies. One of the reasons the availability of etchant species and byproduct residue vary across a wafer surface is that the input and distribution of processing gases and the removal of processing gases and etch byproducts from the processing chamber is not always uniform. Another reason is that there is different spacing between pattern features at different locations (positions) on the substrate surface.

As the device size shrinks, there is less tolerance for nonuniformity of etch rate across the substrate surface and less tolerance for nonuniformity in the etched feature profile. The present invention discloses a method of etching organic layers, and in particular anti-reflective coating layers, which provides improved etch rate uniformity and improved critical dimension control of the etched feature across the substrate surface, while providing selectivity favoring etching of the antireflective coating layer relative to an underlying silicon-containing substrate.

SUMMARY OF THE INVENTION

The present invention relates to semiconductor processing, and to the plasma etching of organic layers, and in particular antireflective coating layers. We have discovered a particular combination of gases useful in producing chemically reactive plasma species, which provides unexpected control over etched feature critical dimension, etch profile, and uniformity of etch across a substrate surface despite a difference in the spacing of etched features over the substrate surface.

The combination of gases which produces chemically reactive plasma species consists essentially of $C_xH_yF_z/HBr/O_2$, where x ranges from 1 to 4, y ranges from 0 to 3, and z ranges from 1 to 10. Oxygen atoms may be substituted for about 30% of the hydrogen atoms in limited amounts in the $C_xH_yF_z$ formula. Essentially inert gases which do not produce chemically reactive species may be added to the $C_xH_yF_z/HBr/O_2$ combination of etchant-species producing gases. A combination of $CF_4/HBr/O_2$ has been demonstrated to work well.

Critical Dimension (CD) uniformity control across the surface of the substrate is generally improved by using a volumetric ratio of $C_xH_yF_z$:HBr ranging from about 2:1 to about 5:1, with a range of about 3:1 to about 4:1 being preferred. A low pressure (less than about 20 mTorr), and a high plasma density (between about $10^{10} e^-/cm^3$ and about $10^{11} e^-/cm^3$) also helps improve CD uniformity control.

The volumetric ratio of $(C_xH_yF_z+HBr):O_2$ should range between about 1:1 to about 4.5:1, with a range of about 2:1 to 3:1 being preferred. An increase in the volumetric ratio up to at least about 3:1 tends to improve CD control at a given location on the substrate, while also improving the critical dimension uniformity across the wafer.

DETAILED DESCRIPTION OF THE PREFERRED EMBODIMENTS

As a preface to the detailed description, it should be noted that, as used in this specification and the appended claims, the singular forms "a", "an", and "the" include plural referents, unless the context clearly dictates otherwise. Thus, for example, the term "a semiconductor" may include any one of a variety of different materials which are known to have the behavioral characteristics of a semiconductor. Reference to a substrate may include any of the substrates used in the semiconductor industry, such as silicon, gallium arsenide, glass, and ceramic, by way of example and not by way of limitation.

A method is disclosed for the etching of organic film layers, and in particular antireflection coating layers. The method employs plasma etching where the major etchant species of the plasma comprise fluorine and oxygen. In addition, the plasma includes species which are designed to passivate/protect the etched surface as etching progresses, to provide control over the profile of an etched feature. The plasma source gas may also contain diluent gases which are essentially inert in terms of etching or passivating the feature surface during the etch process.

In some instances a plasma source gas compound which functions to create etchant species may also create passivating species. A compound of this kind may be used in combination with a source gas or source gas compound which principally creates etchant species and/or a source gas or source gas compound which principally creates a passivation material upon an etched surface, to provide a more uniform etch across a wafer surface. Use of a compound of this kind is particularly helpful in reducing the shift in critical dimension across a wafer when the spacing between etched features on a wafer varies substantially across the wafer surface.

I. An Apparatus for Practicing the Invention

The embodiment example etch processes described herein were carried out in a Centura® Integrated Processing System available from Applied Materials, Inc. of Santa Clara, Calif. The system is shown and described in U.S. Pat. No. 5,583,737 to Collins et al., the disclosure of which is hereby incorporated by reference. Although the etch process chamber used in the EXAMPLES presented herein is shown in schematic in FIG. 1, any of the etch processors available in the industry should be able to take advantage of the etch chemistry described herein, with some adjustment to other process parameters.

Figure 1:
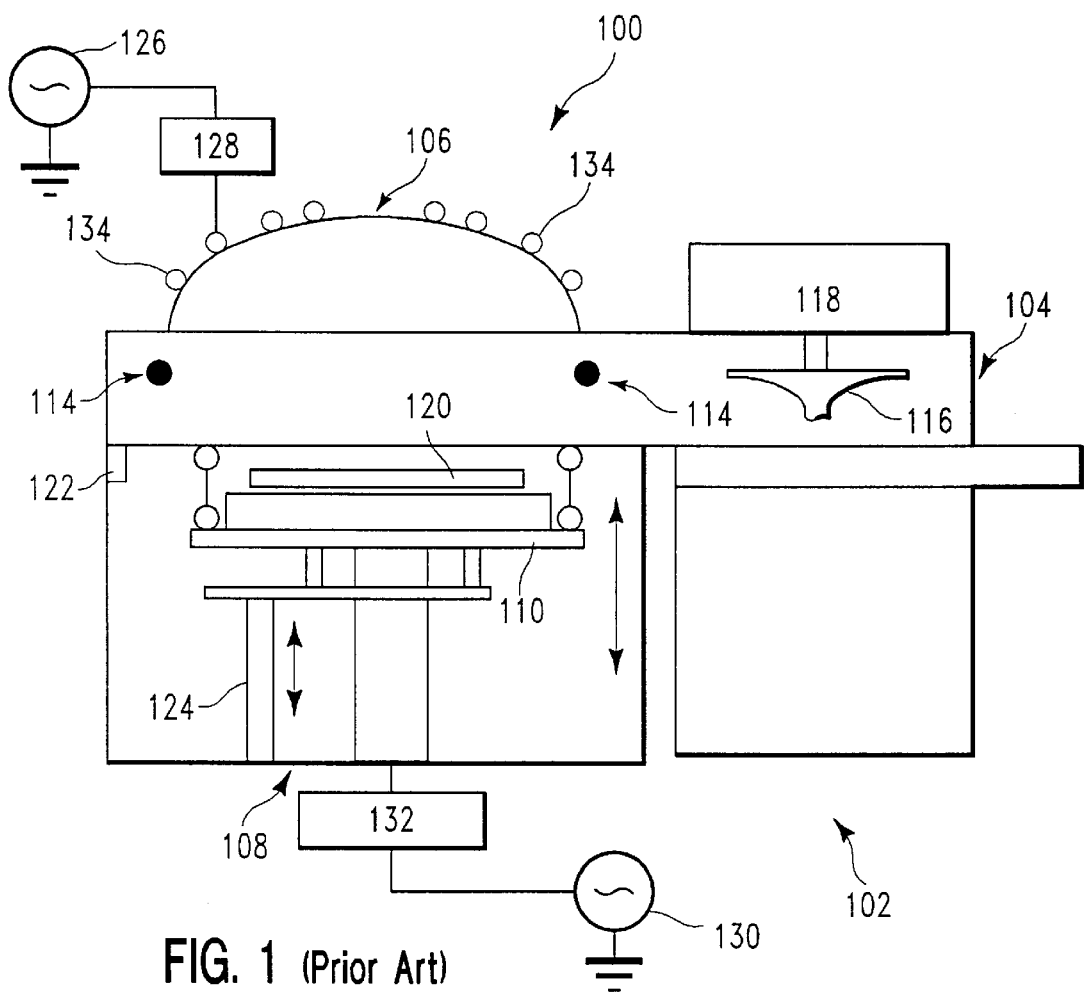
FIG. 1 shows a schematic of a preferred embodiment plasma processing apparatus of the kind which can be used to carry out the etching processes described herein.

The equipment shown in schematic in FIG. 1 includes a Decoupled Plasma Source (DPS) of the kind described by Yan Ye et al. at the Proceedings of the Eleventh International Symposium of Plasma Processing, May 7, 1996 and as published in the Electrochemical Society Proceedings, Volume 96-12, pp. 222–233 (1996). FIG. 1 is a schematic of an individual CENTURA® DPS™ polysilicon etch chamber 102 of the type used in the Applied Materials' CENTURA® polysilicon etch system. The CENTURA® DPS™ polysilicon etch chamber 100 is configured to be mounted on a standard CENTURA® etch mainframe.

The CENTURA® DPS™ polysilicon etch chamber 100 consists of an upper chamber 104 having a ceramic dome 106, and a lower chamber 108. The lower chamber 108 includes a monopolar electrostatic chuck (ESC) cathode 110. Gas is introduced into the chamber via glass injection nozzles 114 for uniform gas distribution. Chamber pressure is controlled by a closed-loop pressure control system 118 with a throttle valve 116. During processing, a substrate 120 is introduced into the lower chamber 108 through inlet 122. The substrate 120 is held in place by means of a static charge generated on the surface of electrostatic chuck (ESC) cathode 110 by applying a DC voltage to a conductive layer located under a dielectric film on the chuck surface. The cathode 110 and substrate 120 are then raised by means of a wafer lift 124 and a seal is created against the upper chamber 104 in position for processing. Etch gases are introduced into the upper chamber 104 via the ceramic gas injection nozzles 114. The polysilicon etch chamber 100 uses an inductively coupled plasma source power 126 and matching network 128 operating at 12.56 MHZ which is connected to inductive coil 134 for generating and sustaining a high density plasma. The wafer is biased with an RF source 130 and matching network 132 operating at 13.56 MHZ. Power to the plasma source 126 and substrate biasing means 130 are controlled by separate controllers (not shown). The temperature on the surface of the etch chamber walls is controlled using liquid-containing conduits (not shown) which are located in the walls of the etch chamber 100. The temperature of the semiconductor substrate is controlled by stabilizing the temperature of the electrostatic chuck cathode 110 upon which the substrate 120 rests. The helium gas is used to facilitate heat transfer between the substrate and the pedestal. During the etch process, the substrate 120 surface is gradually heated by the plasma to a steady state temperature which is approximately 10 to 40° C. higher than the substrate support platen temperature, depending on the process conditions. It is estimated that the substrate surface temperature was typically around 40° C. to 85° C. during most of our experiments. The surface of the etching chamber 100 walls was maintained at about 80° C. using the cooling conduits previously described.

When the end point of an etch is signaled by the etch reaching an interface with a different material, an endpoint subsystem (not shown) senses the end of the etch process by monitoring changes in the light emitted by the plasma in the etch chamber 100. Data is then displayed on a PC monitor. The operator sets an algorithm which controls the endpoint system.

Figure 2:
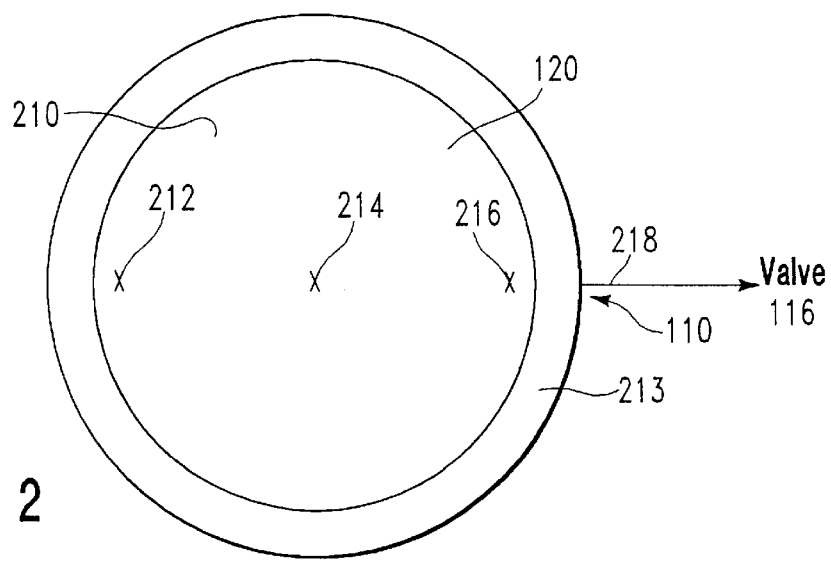
FIG. 2 shows a schematic of a wafer surface, indicating the top, bottom, and center locations of a wafer relative to the schematic of the processing apparatus shown in FIG. 1.

FIG. 2 shows a schematic of a substrate 120 surface 210, indicating the top 212, center 214, and bottom 216 surface locations on substrate 120 (a silicon wafer in this case). These surface locations are shown, relative to the schematic of the processing apparatus shown in FIG. 1, where arrow 218 indicates the direction toward vacuum throttle valve 116, and substrate 120 is shown resting on upper surface 213 of electrostatic chuck 110.

II. Examples of the Etching of an ARC

A particular plasma etch chemistry has been discovered to provide advantages in etching an organic layer such as an antireflective coating. In particular, the antireflective coating may be etched to have both a uniform critical dimension across a semiconductor wafer substrate surface, and to maintain this uniformity of critical dimension despite a difference in etched feature spacing at any given location on the wafer substrate surface. In addition to the plasma chemistry, particular process variables have been discovered which have an important affect on the critical dimension uniformity of the etched feature.

Figure 3A:
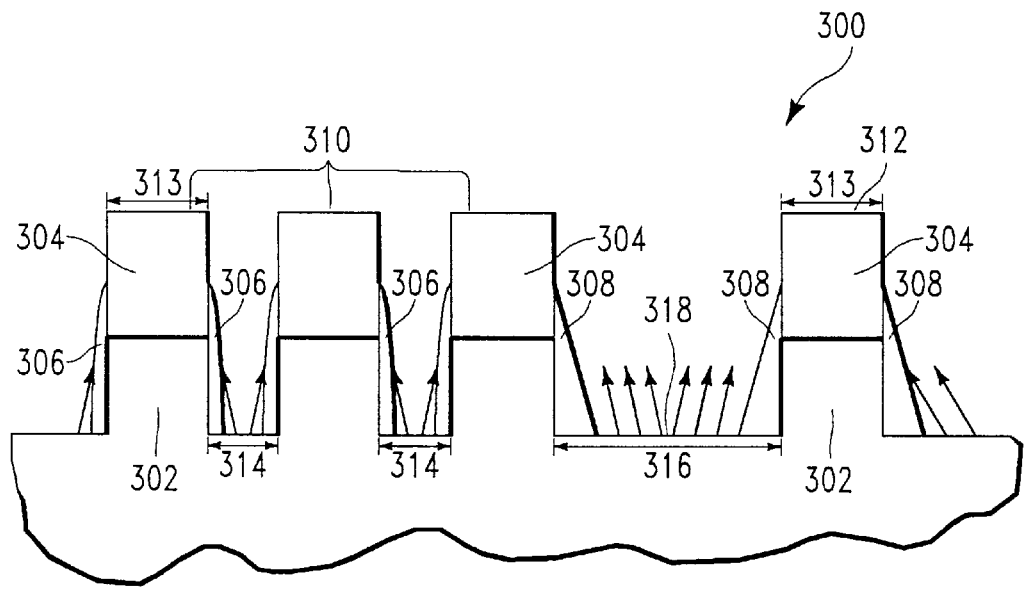
FIG. 3A shows a schematic of an etched feature in which passivation of the etched surface is etch by-product induced.

FIG. 3A shows a schematic of an etched feature structure 300 which includes an etched polysilicon substrate 302, with overlying etched antireflective coating (ARC) 304. The etched pattern is made up of lines 310 and 312 and spaces 314 and 316, where spaces 314 are such that lines 310 are densely present on polysilicon substrate 302, and spaces 316 are such that lines 312 are more isolated on polysilicon substrate 302. Typical dimensions of the pattern would be such that lines 310 have a line width 313 of about 0.18 µm, and spaces 314 have a width of about 0.22 µm in an area where lines 313 are densely located. In areas of the wafer where the lines are more isolated, the lines 312 have a width of about 0.18 µm but the spaces 316 have a width of greater than about 15.0 µm. The etchant chemistry used to etch the lines and spaces in FIG. 3A is one in which the predominant passivation of the etched surface is etch reaction by-products induced. This is represented by the arrows rising from the surface of polysilicon substrate 302. As illustrated in FIG. 3A, the passivation sidewall 306 in the area of the densely located lines 310 is rather uniform and the sidewalls of the etched line, including passivation layer, approach the vertical sidewall desired (the term "vertical profile" refers to a line profile where the sidewalls which are perpendicular to the surface on which the line stands are 90° from horizontal). A vertical sidewall permits close packing of device structures. However, the passivation sidewall 308 in the area of the isolated lines 312 is considerably larger, with a significant taper from a wide thickness at the bottom near the etched polysilicon bottom surface 318 to a smaller thickness higher on the sidewall of the etched line, as illustrated with reference to line 312. Not illustrated in FIG. 3A is the observation that the shift in critical dimension (to a narrower line width, absent the passivation sidewall layer) also occurs in the area where the lines are more isolated.

Figure 3B:
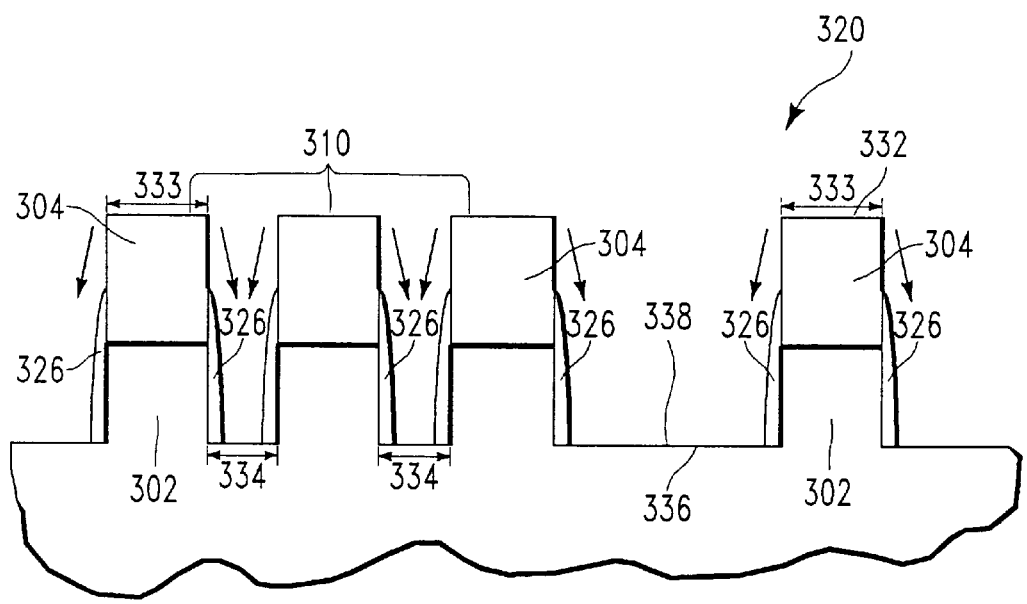
FIG. 3B shows a schematic of an etched feature in which passivation of the etched surface is induced by the etching species as well as by etch by-products.

FIG. 3B shows a schematic of an etched feature structure 320 which includes an etched polysilicon substrate 302, with overlying etched antireflective coating (ARC) 304. The etched pattern is made up of lines 330 and 332 and spaces 334 and 336, where spaces 334 are such that lines 330 are densely present on polysilicon substrate 302, and spaces 336 are such that lines 332 are more isolated on polysilicon substrate 302. Typical dimensions of the pattern would be such that lines 330 have a line width 333 of about 0.18 µm, and spaces 334 have a width of about 0.22 µm in an area where lines 330 are densely located. In areas of the wafer where the lines are more isolated, the lines 332 have a width of about 0.18 µmm but the spaces 336 have a width of greater than about 15.0 µm. The etchant chemistry used to etch the lines and spaces in FIG. 3B is one in which the predominant passivation of the etched surface is etch species induced. This is represented by the arrows moving downward from the ARC toward the etched surface 338 of polysilicon substrate 302. As illustrated in FIG. 3B, the passivation sidewall 326 in relatively consistent in thickness, independent of line 330 or 332 density. The passivation sidewalls 326 approach the vertical sidewall (90 ° from horizontal) desired, to permit close packing of device structures.

The term semiconductor "feature" typically refers to metal lines, trenches and openings of the kind found in semiconductor device structures, and to other structures which make up the topography of the substrate surface; feature size often refers to the size of the smallest feature on the wafer. In addition to the need to etch feature dimensions and profiles consistently, independent of the spacing between features, it is critically important that the dimension and profile of an etched feature be controlled over the entire surface of the substrate. Since the flow of plasma source gas etchant and passivation compounds into the etch chamber, and the removal of etch by-products from the chamber does not provide precisely the same etching conditions at each point on the substrate wafer surface, achievement of a uniform etch over the entire surface of the substrate is difficult. This is the case even when the spacing between features is uniform, and is further complicated when the spacing between features varies.

Example One

Figure 4A:
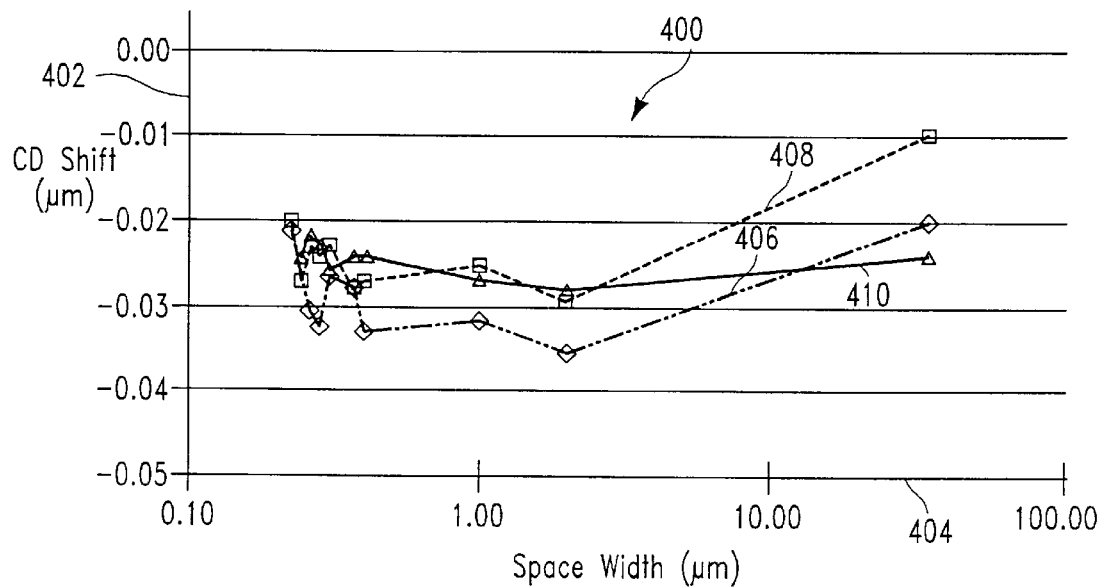
FIG. 4A shows a graph of the shift in critical dimension of the etched feature as a function of the spacing between etched features, for the top, bottom, and center surfaces of a wafer when etching species depletion is the most influential factor during etching of a feature.

FIG. 4A is a graph 400 which shows data for the etching of a structure of the kind described with reference to FIGS. 3A and 3B. This is a comparative example based on a prior art source gas composition, where other etch parameters are within the range of those used in the method of the present invention. The CD shift is the difference between line width of the etched ARC and the line width in the photoresist used to pattern the ARC (and the underlying etched polysilicon). Thus, a positive CD shift indicates that the etched CD is larger than the pattern CD prior to etch. A negative CD shift indicates that the etched CD is smaller than the pattern CD prior to etch.

It is highly desired to have a minimal shift in the line width, but critical that the shift in line width be consistent from etched line to etched line. The shift in critical dimension in $\mu$m is shown on the axis numbered 402, for an etched line in a pattern of lines and spaces. The shift in critical dimension is shown as a function of the spacing between the lines in $\mu$m, on the axis numbered 404. There are three plots on the graph, plot 406 which represents a bottom location on a substrate wafer, plot 408, which represents a center location on the wafer, and plot 410 which represents a top location on a substrate wafer, as illustrated with reference to FIG. 2.

Graph 400 makes it possible to look at the variation in critical dimension shift which is due to location on the substrate surface and the variation in critical dimension shift which is due to differences in spacing between the lines being etched. Due to the size reductions in semiconductor device structures, device fabricators are looking for a critical dimension shift variation across the wafer (uniformity) of about 10 nm (0.01 $\mu$m). FIG. 4A is representative of the critical dimension shift when the plasma source gas is $Cl_2/O_2/Ar$. The critical dimension shift (line width) uniformity across the wafer for all space width variations is approximately 27.5 nm. (2.7 times the desired shift). In addition to the plasma source gas composition provided above, the following process variables were used. The sccm of $Cl_2$ was 20, the sccm of $O_2$ was 20, and the sccm of Ar was 20. The source power applied was 210 W (the term "source power" refers to the power that is responsible for sustaining the plasma by providing a major portion of the energy to ionize the neutral species in the chamber). The bias power applied was 30 W (the term "bias power" refers to the power that is applied to create a negative voltage on the surface of the electrostatic chuck, to attract high energy species toward the substrate resting on the electrostatic chuck, so that anisotropic etching is obtained). The pressure in the etch chamber was about 3 mTorr. The electrostatic chuck temperature was about 45° C., so the resulting substrate temperature was about 55° C.

Example Two

Figure 4B:
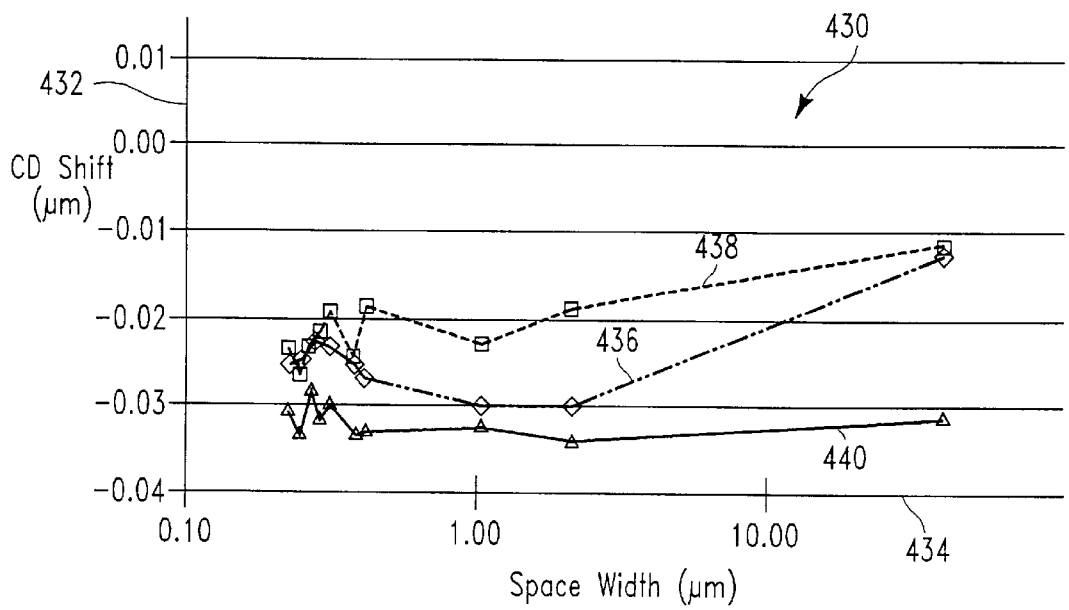
FIG. 4B shows a graph of the shift in critical dimension of the etched feature as a function of the spacing between etched features, for the top, bottom, and center surfaces of a wafer when passivation material deposition is the most influential factor during etching of a feature.

FIG. 4B is a graph 430 which shows data for the etching of a structure of the kind described with reference to FIGS. 3A and 3B. This is a comparative example based on a prior art source gas composition, where other etch parameters are within the range of those used in the method of the present invention. The shift in critical dimension in $\mu$m is shown on the axis numbered 432, for an etched line in a pattern of lines and spaces. The shift in critical dimension is shown as a function of the spacing between the lines in $\mu$m, on the axis numbered 434. There are three plots on the graph, plot 436 which represents a bottom location on a substrate wafer, plot 438, which represents a center location on the wafer, and plot 440 which represents a top location on a substrate wafer, as illustrated with reference to FIG. 2. Graph 430 makes it possible to look at the variation in critical dimension shift which is due to location on the substrate surface and the variation in critical dimension shift which is due to differences in spacing between the lines being etched. FIG. 4B is representative of the critical dimension shift when the plasma source gas is $HBr/O_2$. The critical dimension shift (line width) uniformity across the wafer for all space width variations is approximately 20.3 nm. (2.03 times the desired shift). In addition to the plasma source gas composition provided above, the following process variables were used. The sccm of HBr was 80, and the sccm of $O_2$ was 20. The source power applied was 300 W. The bias power applied was 40 W. The pressure in the etch chamber was about 4 mTorr. The electrostatic chuck temperature was about 45° C., so the resulting substrate temperature was about 55° C.

Example Three

Figure 5:
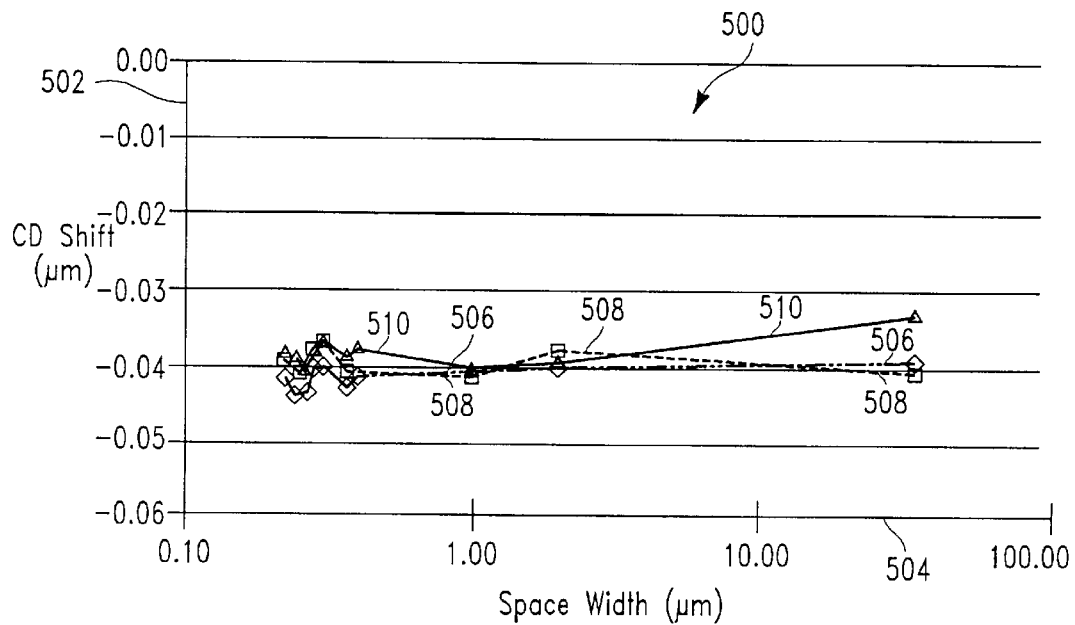
FIG. 5 shows a graph of the shift in critical dimension of the etched feature as a function of the spacing between etched features, for the top, bottom, and center surfaces of a wafer when passivation material deposition and etchant species depletion factors are more evenly balanced, as provided in the present invention.

FIG. 5 is a graph 500 which shows data for the etching of a structure of the kind described with reference to FIGS. 3A and 3B using one embodiment of the method of the present invention. The shift in critical dimension in $\mu$m, is illustrated on the axis numbered 502, for an etched line in a pattern of lines and spaces. The shift in critical dimension is shown as a function of the spacing between the lines in $\mu$m, on the axis numbered 504. There are three plots on the graph, plot 506 which represents a bottom location on a substrate wafer, plot 508, which represents a center location on the wafer, and plot 510 which represents a top location on a substrate wafer, as illustrated with reference to FIG. 2. Graph 500 makes it possible to look at the variation in critical dimension shift which is due to location on the substrate surface and the variation in critical dimension shift which is due to differences in spacing between the lines being etched. FIG. 5 is representative of the critical dimension shift when the plasma source gas is $CF_4/HBr/O_2$. The critical dimension shift (line width) variation across the wafer for all space width variations is approximately 10.2 nm. In addition to the plasma source gas composition provided above, the following process variables were used. The sccm of $CF_4$ was 60, the sccm of HBr was 20, and the sccm of $O_2$ was 40. The source power applied was 300 W. The bias power applied was 80 W. The pressure in the etch chamber was about 4 mTorr. The electrostatic chuck temperature was about 45° C., so the resulting substrate temperature was about 55° C.

Example Five

FIGS. 6A through 6D show a series of graphs illustrating the effect of the volumetric feed ratio of the combination etchant/passivant source gas compound to the principal passivant source gas compound on the etched feature critical dimension uniformity across the wafer substrate.

For this series of experiments, the source power applied was 300 W. The bias power applied was 80 W. The pressure in the etch chamber was about 4 mTorr. The electrostatic chuck temperature was about 45° C., so the resulting substrate temperature was about 55° C.

Figure 6A:
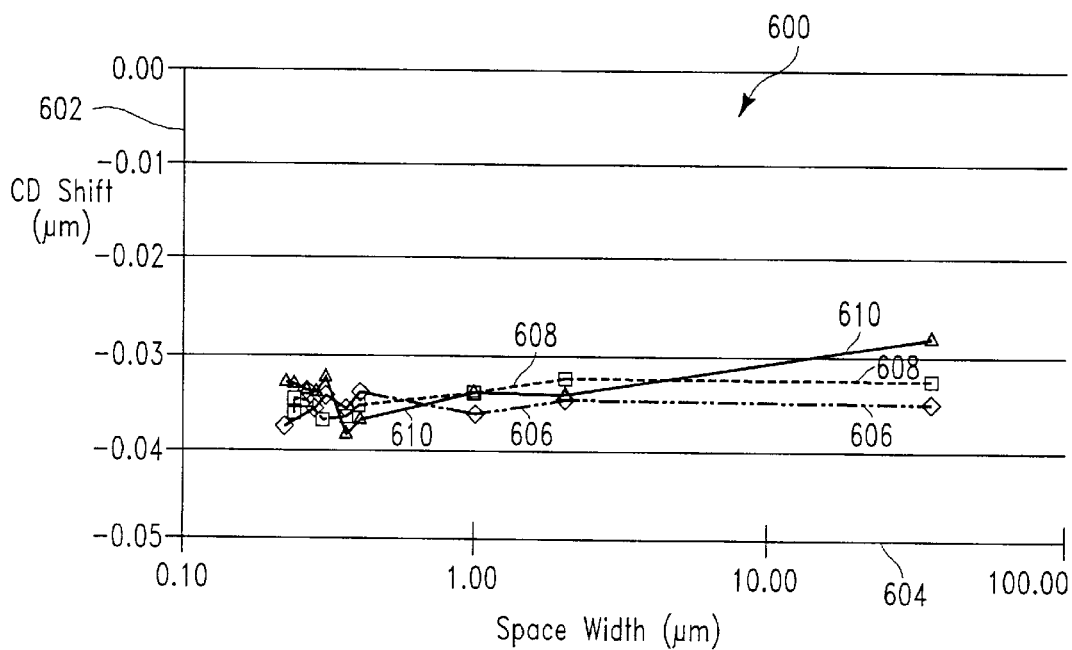
FIGS. 6A through 6D show a series of graphs illustrating the effect of the volumetric feed ratio of the combination etchant/passivant source gas compound to the principal passivant source gas compound on the etched feature critical dimension uniformity across the wafer substrate.

With reference to FIG. 6A, the volumetric flow ratio of $CF_4$:HBr was 4:1 and the volumetric flow ratio of ($CF_4$+HBr):$O_2$ was 2.5:1. The critical dimension shift variation across the entire wafer surface, where the line width was about 0.14 $\mu$m and the space between lines ranged from about 0.2 $\mu$m to about 15.0 $\mu$m, was 10.8 nm.

Figure 6B:
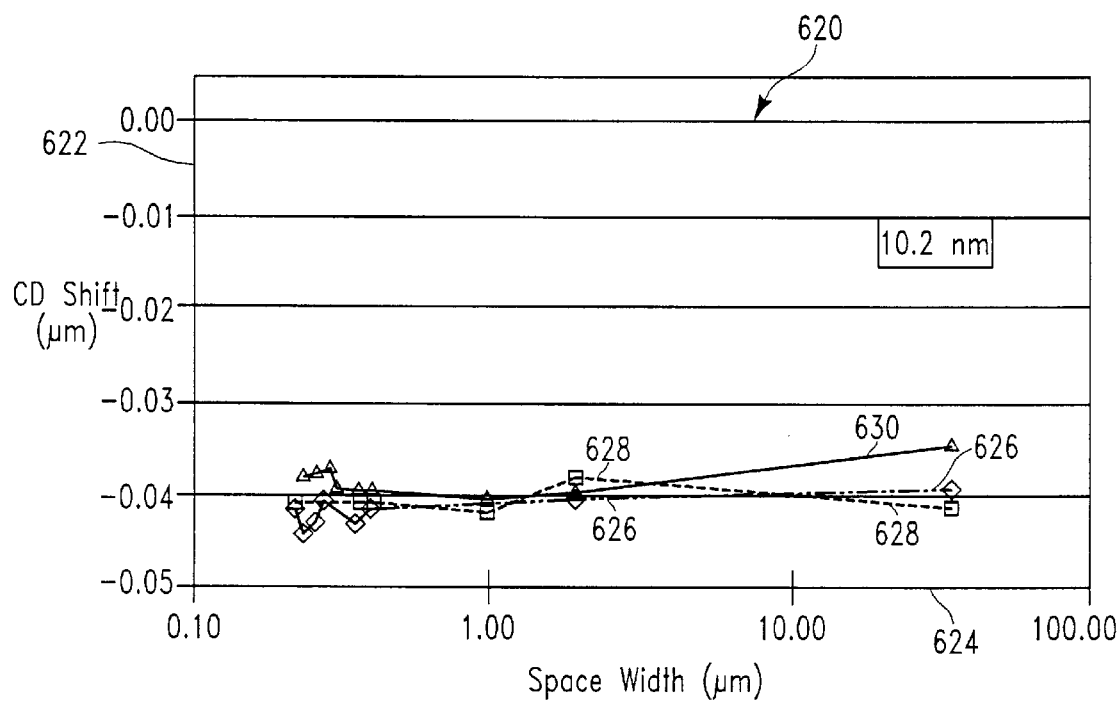

With reference to FIG. 6B, the volumetric flow ratio of $CF_4$:HBr was 3:1 and the volumetric flow ratio of ($CF_4$+

HBr):O$_2$ was 2.0:1. The critical dimension shift variation across the entire wafer surface, where the line width was about 0.14 μm and the space between lines ranged from about 0.2 μm to about 15 μm, was 10.2 nm.

Figure 6C:
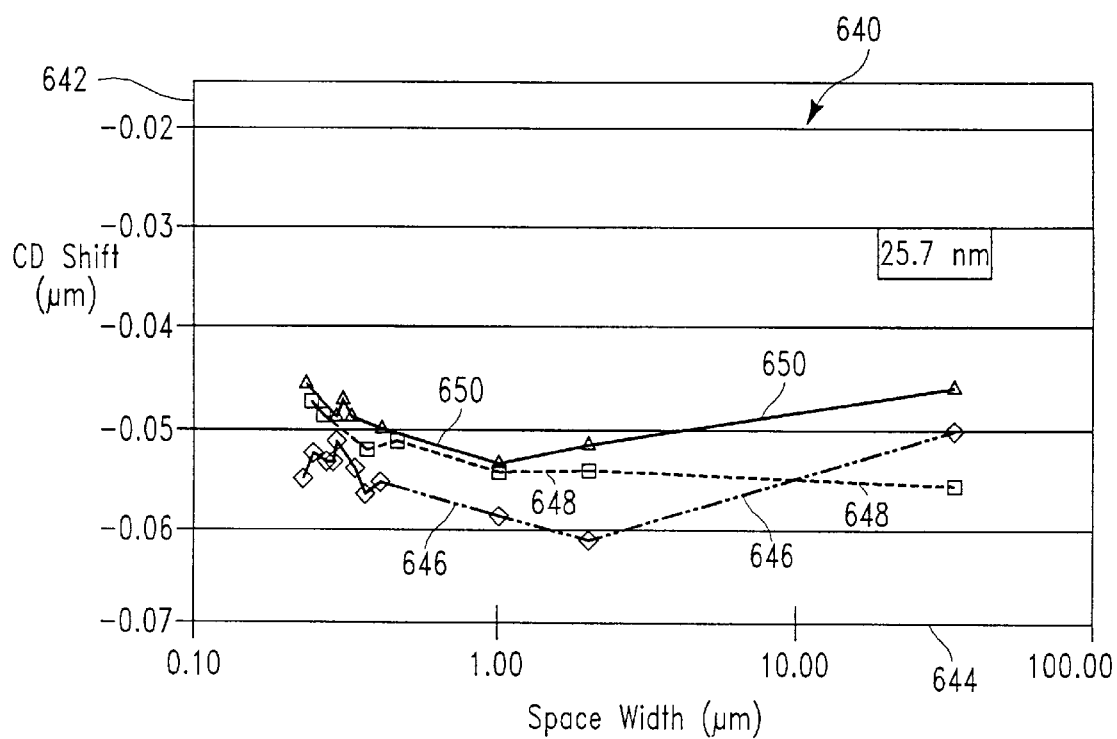

With reference to FIG. 6C, the volumetric flow ratio of CF$_4$:HBr was 1:1 and the volumetric flow ratio of (CF$_4$+HBr):O$_2$ was 2.0:1. The critical dimension shift variation across the entire wafer surface, where the line width was about 0.14 μm and the space between lines ranged from about 0.2 μm to about 15 μm, was 25.7 nm.

Figure 6D:
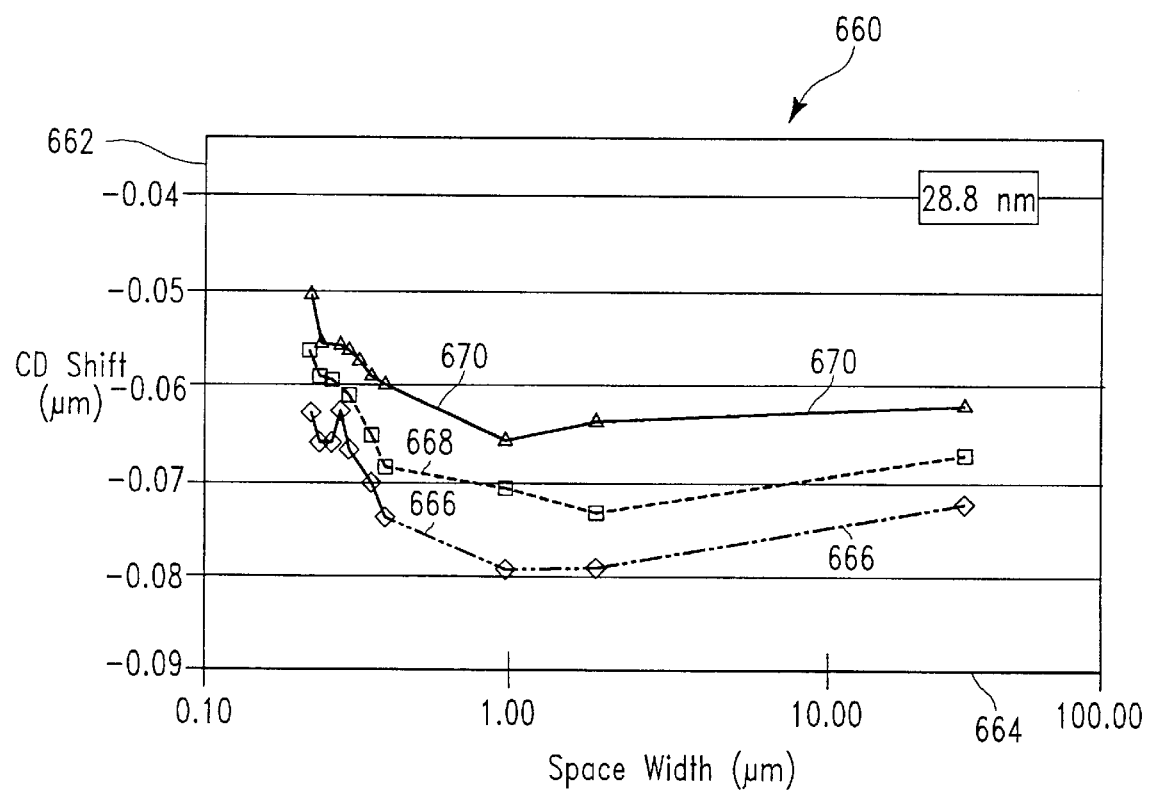

With reference to FIG. 6D, the volumetric flow ratio of CF$_4$:HBr was 1:3 and the volumetric flow ratio of (CF$_4$+HBr):O$_2$ was 2.0:1. The critical dimension shift variation across the entire wafer surface, where the line width was about 0.14 μm and the space between lines ranged from about 0.2 μm to about 15 μm, was 28.8 nm.

A review of this series of experiments indicates that a CF$_4$:HBr ratio of 1:1 or less does not produce the desired critical dimension shift variation value of about 10.0 nm over the entire wafer surface. Even when the line width spacing is approximately equal to the line width, there is considerable critical dimension shift from top to bottom of the wafer substrate. When the CF$_4$:HBr volumetric flow ratio is 3:1 to 5:1, the desired results are obtained. Where the volumetric flow ratio is 1:1, the results are not as good. The precise point between a CF$_4$:HBr volumetric flow ratio of 1:1 and 3:1 at which good results are obtained can be determined with minimal experimentation for a given processing apparatus.

Example Six

Figure 7A:
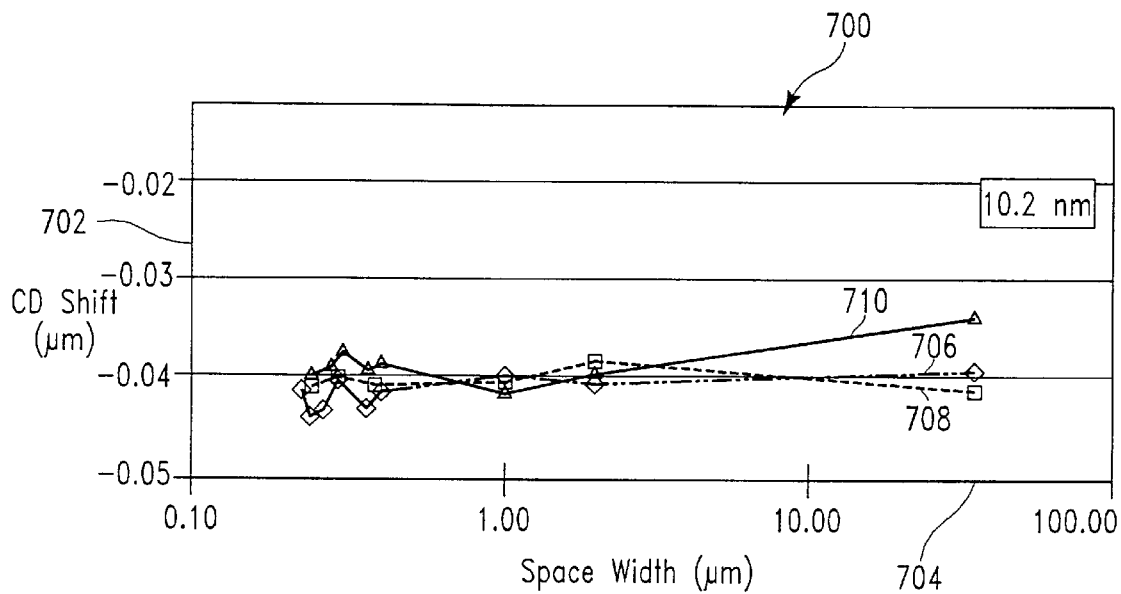
FIGS. 7A and 7B show the effect of the ratio of a combination the volumetric feed rates for the principal passivation material and principal etchant species material to the volumetric feed rate of a second etchant species material.
Figure 7B:
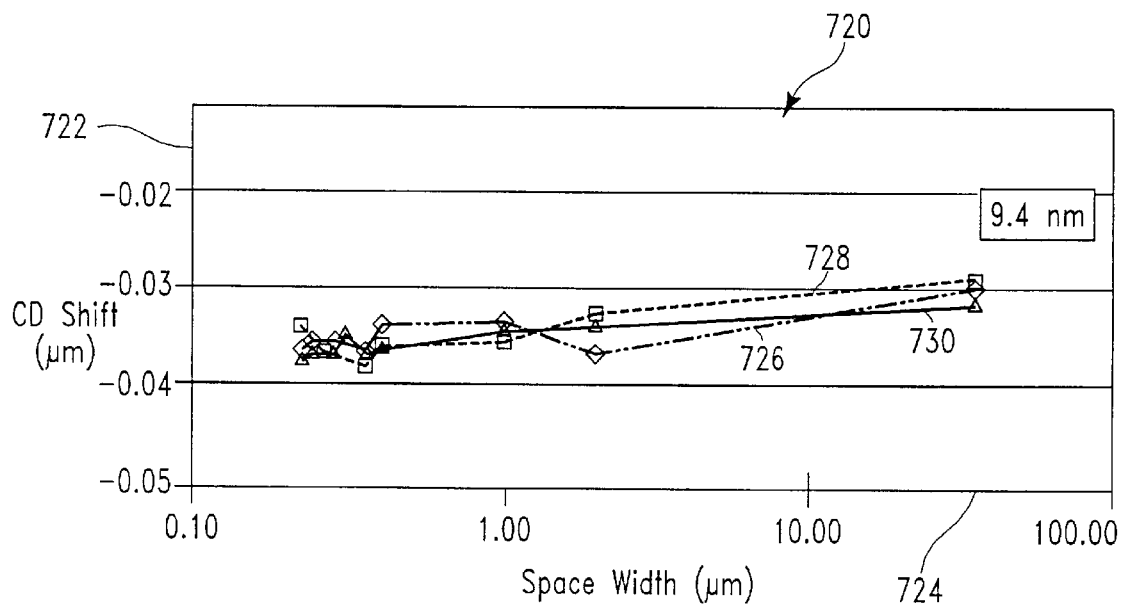

FIGS. 7A and 7B illustrate the effect of the volumetric feed ratio of (CF$_4$+HBr):O$_2$ on the etched feature critical dimension uniformity across the wafer substrate.

For this series of experiments, the source power applied was 300 W. The bias power applied was 80 W. The pressure in the etch chamber was about 4 mTorr. The electrostatic chuck temperature was about 45° C., so the resulting substrate temperature was about 55° C.

With reference to FIG. 7A, the volumetric flow ratio of (CF$_4$+HBr):O$_2$ was 2:1, and the volumetric flow ratio of CF$_4$:HBr was 3:1. The critical dimension shift across the entire wafer surface, where the line width was about 0.14 μm and the space between lines ranged from about 0.2 μm to about 15 μm, was 10.2 nm.

With reference to FIG. 7B, the volumetric flow ratio of (CF$_4$+HBr):O$_2$ was 3:1, and the volumetric flow ratio of CF$_4$:HBr was 3:1. The critical dimension shift across the entire wafer surface, where the line width was about 0.14 μm and the space between lines ranged from about 0.2 μm to about 15 μm, was 9.4 nm.

These experiments, in combination with those previously described indicate that when the ratio of CF$_4$:HBr is greater than 1:1 by some nominal amount, and the volumetric flow ratio of (CF$_4$+HBr):O$_2$ is at least 2:1, the critical dimension shift across the entire wafer surface, even with wide variation in spacing between the lines (etched feature density) will be in the range of 10 nm.

In general, we observed that an increase in the total amount of process gas flow to the etch chamber, for example between 120 sccm total and 180 sccm total had only a limited effect on the critical dimension shift variation across the entire wafer surface, with the critical dimension uniformity being 10.2 nm at 120 sccm and 15.3 nm at 180 sccm. In both instances, the ratio of CF$_4$:HBr was 3:1, and the ratio of (CF$_4$+HBr):O$_2$ was 2:1. A change in process chamber pressure from 4 mTorr to 6 mTorr at the 120 sccm conditions resulted in a change in the critical dimension uniformity from 10.2 nm to 11.4 nm. A change in the plasma source power from 300 W to 240 W at the 120 sccm conditions resulted in a change in the critical dimension uniformity from 10.2 to 16.0, indicating that a source power in the 300 W range provides an improvement in critical dimension uniformity. We investigated further increases in source power wattage, and found that the critical dimension uniformity remained approximately the same. The addition of nitrogen at a flow rate of 10 sccm at the 120 sccm conditions resulted in a slight increase in critical dimension uniformity from 9.5 nm to 9.8 nm.

In general, selectivity favoring the etching of polysilicon compared with ARC is improved by increasing the amount of HBr relative to CF$_4$. A typical etch rate for polysilicon under the conditions provided above for a total flow of 120 sccm, is about 500 Å/min, while the etch rate for the ARC is about 2,500 Å/min.

Figure 8A:
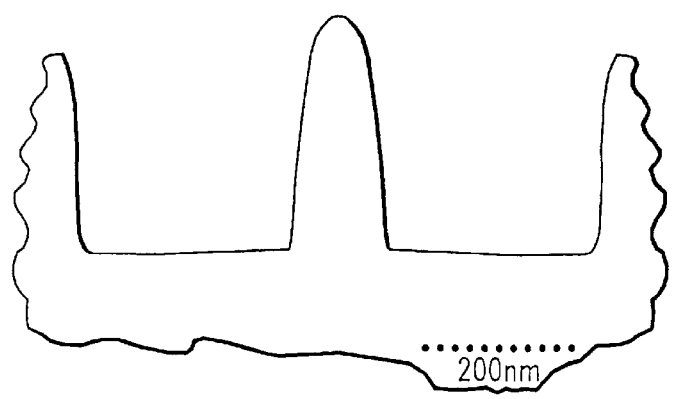
FIGS. 8A and 8B show schematics of the photomicrograph of an etched feature created using the method of the invention, when the etched feature is a series of lines and spaces, for one condition where the features are located relatively close together, for substrate wafer locations at the top of the wafer.
Figure 8B:
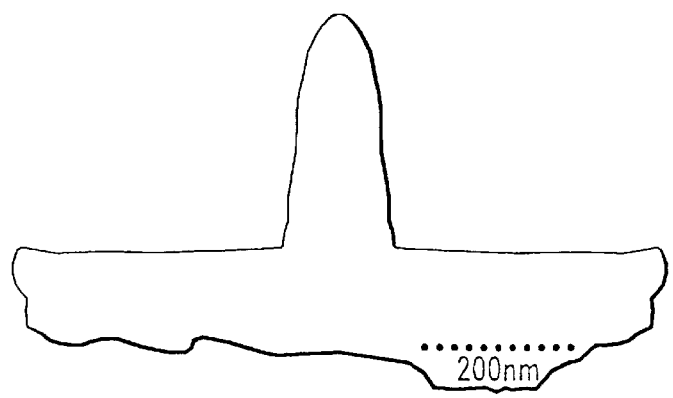
Figure 8C:
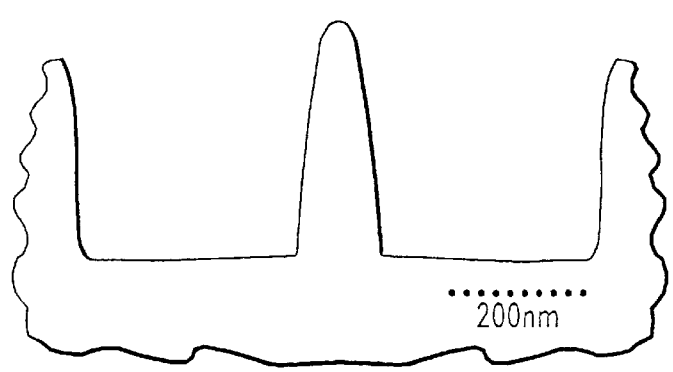
FIGS. 8C and 8D show schematics of the photomicrograph of an etched feature created using the method of the invention, when the etched feature is a series of lines and spaces, for another condition where the features are located relatively far apart, for substrate locations at the center of the wafer.
Figure 8D:
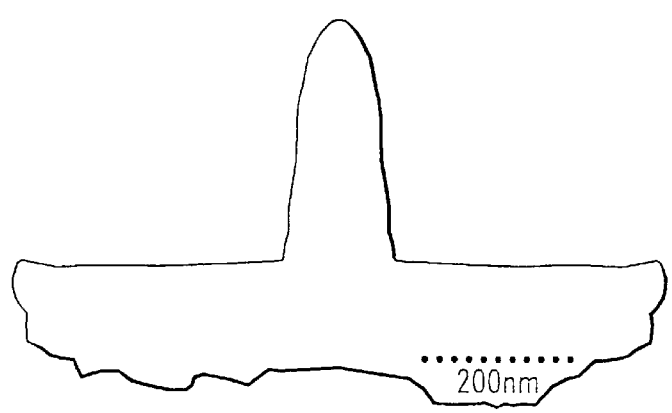

FIGS. 8A through 8D show schematics of the photomicrograph of an etched pattern of lines and spaces created using the method of the invention. The process conditions used during etch of the feature were 60 sccm of CF$_4$; 20 sccm of HBr; 40 sccm of O$_2$, a chamber pressure of 4 mTorr, 300 W of plasma source power; 90 W of substrate bias power; and an electrostatic chuck temperature of 45° C. In FIG. 8A, the lines were 0.18 μm in width and the spaces were 0.22 μm, with the substrate surface location being at the top of the wafer. In FIG. 8B, the lines were the same width, but the spaces were 2.0 μm, with the location being at the top of the wafer. In FIG. 8C, the lines were 0.18 μm in width and the spaces were 0.22 μm, with the substrate surface location being at the center of the wafer. In FIG. 8D, the lines were the same width, but the spaces were 2.0 μm, with the location being at the center of the wafer. Clearly, an excellent vertical profile is obtained in each instance.

The above described preferred embodiments are not intended to limit the scope of the present invention, as one skilled in the art can, in view of the present disclosure expand such embodiments to correspond with the subject matter of the invention claimed below.

We claim:

1. A method of plasma etching an organic coating layer, comprising: exposing a substrate having organic layer on an exposed surface to a plasma generated from a source gas consisting essentially of at least one carbon and fluorine-comprising compound, oxygen, and at least one bromine-comprising compound, wherein the volumetric flow ratio of said fluorine-comprising compound to said bromine-containing compound ranges from about 2:1 to about 5:1, and wherein the volumetric flow ratio of said fluorine-comprising compound and said bromine-containing compound combined to said oxygen ranges from about 1:1 to about 4.5:1.

2. The method of claim 1, wherein said carbon and fluorine-comprising compound has a formula $C_xH_yF_z$, where x=1–4, y=0–3, and z=1–10.

3. The method of claim 2, wherein oxygen atoms are substituted for hydrogen atoms in said carbon and fluorine-comprising compound, up to about 30% of said hydrogen atoms.

4. The method of claim 2, wherein said carbon and fluorine-comprising compound is CF$_4$.

5. The method of claim 1, wherein said bromine-comprising compound is HBr.

6. The method of claim 2, wherein said bromine-comprising compound is HBr.

7. The method of claim 1, or claim 2, or claim 3, or claim 4, or claim 5, or claim 6, wherein said exposed organic layer is an antireflective coating.

8. A method of plasma etching an organic antireflective coating to reduce critical dimension nonuniformity across a substrate surface, comprising: generating a plasma from a plasma source gas which produces chemically reactive plasma species consisting essentially of $C_xH_yF_z$, HBr, and $O_2$, where x ranges from 1 to 4, y ranges from 0 to 3, and z ranges from 1 to 10, wherein a volumetric ratio of $C_xH_yF_z$:HBr ranges from about 2:1 to about 5:1.

9. The method of claim 8, wherein a volumetric ratio of $(C_xH_yF_z+HBr):O_2$ ranges from about 1:1 to about 5:1.

10. The method of claim 8 or claim 9, wherein said volumetric ratio of $C_xH_yF_z$:HBr ranges from about 3:1 to about 4:1.

11. The method of claim 9 wherein said volumetric ratio of $(C_xH_yF_z+HBr):O_2$ ranges from about 2:1 to about 3:1.

12. The method of claim 11, wherein said volumetric ratio of $C_xH_yF_z$:HBr ranges from about 3:1 to about 4:1.

13. A semiconductor structure having at least one layer of polysilicon with at least one overlying layer of an antireflective coating, wherein said structure includes etched features having a critical dimension of 0.20 μm or less and having a critical dimension uniformity over the surface of said structure of 15 nm or less.

14. The structure of claim 13, wherein said critical dimension uniformity is 10 nm or less.

15. The semiconductor structure of claim 13 or claim 14, wherein said etched features include lines and spaces, and wherein spaces between said lines vary by at least a factor of 10.

16. The semiconductor structure of claim 15, wherein said spaces between said lines vary by at least a factor of 100.

17. The semiconductor structure of claim 16, wherein said spaces between said lines vary by as much as a factor of 1,000.

* * * * *